United States Patent
Malhotra et al.

(10) Patent No.: US 8,679,939 B2
(45) Date of Patent: Mar. 25, 2014

(54) MANUFACTURABLE HIGH-K DRAM MIM CAPACITOR STRUCTURE

(71) Applicant: Intermolecular Inc., San Jose, CA (US)

(72) Inventors: Sandra Malhotra, Fort Collins, CO (US); Wim Y. Deweerd, San Jose, CA (US); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/737,467

(22) Filed: Jan. 9, 2013

(65) Prior Publication Data

US 2013/0328168 A1 Dec. 12, 2013

Related U.S. Application Data

(63) Continuation of application No. 13/494,808, filed on Jun. 12, 2012.

(51) Int. Cl.
*H01L 21/20* (2006.01)

(52) U.S. Cl.
USPC ........................................ 438/396; 438/386

(58) Field of Classification Search
USPC ....................................................... 438/396
See application file for complete search history.

(56) References Cited

U.S. PATENT DOCUMENTS

| | | | | |
|---|---|---|---|---|
| 5,599,424 | A | * | 2/1997 | Matsumoto et al. .......... 438/738 |
| 2010/0172065 | A1 | * | 7/2010 | Huang et al. .................. 361/313 |
| 2011/0018100 | A1 | * | 1/2011 | Nakagawa et al. ........... 257/532 |
| 2012/0068183 | A1 | * | 3/2012 | Takemura ........................ 257/60 |
| 2012/0119327 | A1 | * | 5/2012 | Kwon et al. ................... 257/532 |
| 2012/0309160 | A1 | * | 12/2012 | Ramini et al. ................. 438/381 |
| 2013/0052792 | A1 | * | 2/2013 | Malhotra et al. .............. 438/396 |

* cited by examiner

*Primary Examiner* — Charles Garber
*Assistant Examiner* — Brigitte Paterson

(57) ABSTRACT

A method for forming a capacitor stack is described. In some embodiments of the present invention, a first dielectric material is formed above a first electrode material. The first electrode material is rigid and has good mechanical strength and serves as a robust frame for the capacitor stack. The first dielectric material is sufficiently thin (<2 nm) or highly doped so that it remains amorphous after subsequent anneal treatments. A second dielectric material is formed above the first dielectric material. The second dielectric material is sufficiently thick (>3 nm) or lightly doped or non-doped so that it crystallizes after subsequent anneal treatments. A second electrode material is formed adjacent to the second dielectric material. The second electrode material has a high work function and a crystal structure that serves to promote the formation of the high k-value crystal structure of the second dielectric material.

20 Claims, 11 Drawing Sheets

MANUFACTURABLE HIGH-K DRAM MIM CAPACITOR STRUCTURE

CROSS-REFERENCE TO RELATED APPLICATIONS

This is a Continuation application of U.S. patent application Ser. No. 13/494,808, filed on Jun. 12, 2012, which is herein incorporated by reference for all purposes.

This document relates to the subject matter of a joint research agreement between Intermolecular, Inc. and Elpida Memory, Inc.

FIELD OF THE INVENTION

The present invention relates generally to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors cannot be reduced without limit in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Some of the DRAM cell geometries that have been used include "planar", "cup", "stack", "fin", and "crown" designs. Currently, high density DRAM devices use one of the various crown designs. In the crown structure, the inner and outer surfaces of the lower electrode are covered with the dielectric material and the upper electrode. In the cup structure, the inner surface of the lower electrode is covered with the dielectric material and upper electrode.

Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium oxide and zirconium oxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, niobium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C.) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Currently, advanced DRAM capacitor stacks comprise a zirconium oxide-based dielectric material. The tetragonal phase of zirconium oxide has a k-value of about 47. However, for future DRAM devices, a dielectric material with a higher k-value must be developed and qualified. Additionally, future DRAM devices will require that the thicknesses of the electrode materials as well as the dielectric materials are reduced so that the areal packing density targets (i.e. number of bits per square micron) can be met for the future devices. Additional specifications such as the resistance of the electrodes and the leakage current through the device must also be met.

Another issue that must be addressed for advanced DRAM designs involves the mechanical strength and integrity of the materials. For complex shapes such as the fin or crown structures, the first electrode serves as a robust frame for those capacitor structures. DRAM device trends dictate that the area that the capacitor cell occupies on the surface of the device is getting smaller, but the capacitance value must be kept a constant (~20 fF/cell). This is accomplished by designing the cylinder and the structures of the crown geometry to have a smaller diameter and to be as tall as possible (keeping the highest aspect ratio ~20) and also introducing a dielectric material with higher K. Additionally, the thickness of the first electrode continues to decrease as the cylinder diameter decreases. These design factors require the use of a strong and rigid material as the first electrode.

Therefore, there is a need to develop methods to fabricate DRAM capacitor stacks with good mechanical strength that exhibit a high capacitance due to the high k-value of the capacitor dielectric, exhibit low leakage current, and exhibit a low EOT value.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a first dielectric material is formed above a first electrode material. The first dielectric material is sufficiently thin (<2 nm) or highly doped so that it remains amorphous after subsequent anneal treatments. A second dielectric material is formed above the first dielectric material. The second dielectric material is sufficiently thick (>3 nm) or lightly doped or non-doped so that it crystallizes after subsequent anneal treatments. A second electrode material is formed adjacent to the second dielectric material. The second electrode material has a crystal structure that serves to promote the formation of the high k-value crystal structure of the second dielectric material. The capacitor stack is then annealed to crystallize the second dielectric material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
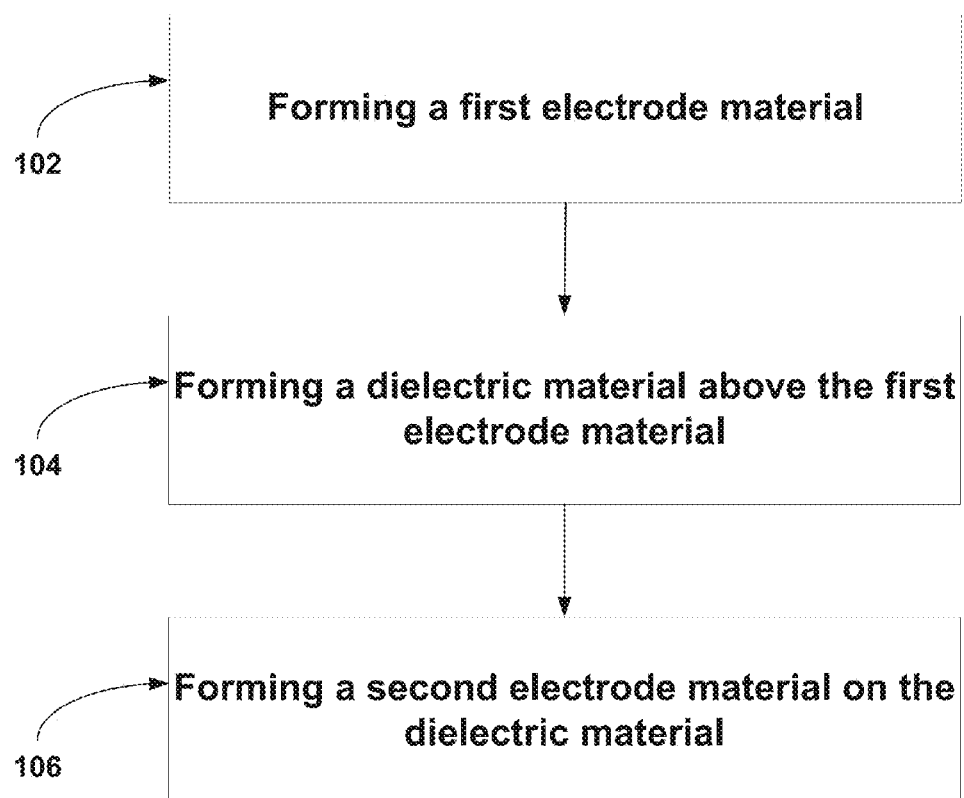
FIG. 1 illustrates a flow chart for the formation of a capacitor stack.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "MIM" as used herein should be understood to encompass any combination of layers that utilize a dielectric with two electrodes, whether or not additional layers are present; for example, the term "MIM" should be understood to encompass metal-insulator-insulator-metal, metal-insulator-insulator-insulator-metal, metal-insulator-metal-insulator-metal and other, similar structures, with or without further insulators, enhancement layers, smoothing or adherence layers or other structures between them. An oxide "layer" (whether used in the context of part or all of an electrode or the dielectric) should be understood to refer to either (a) an entire layer, which may consist of a single layer or one or more "monolayers" that together cooperate to form an oxide layer, as well as (b) individual monolayers. Thus, a "layer" may refer to a single layer, to an aggregate combination of layers, or to one monolayer. The term "nanolayer" refers to a thin deposition that may achieve sparse or complete layer coverage—for example, a single ALD cycle may be used to deposit a nanolayer. The "substrate" may be any material capable of supporting a layer of semiconductor material, and may include a metal conductor, insulator, glass, previously deposited layer (dielectric, or otherwise) or another material, but generally in this disclosure will refer to a metal electrode mounted above a silicon wafer comprising a $SiO_2$ layer or other base. "Preparation," "treatment" or "pretreatment" of a layer typically includes cleaning or oxidizing a substrate to promote good adhesion between a to-be-deposited layer and the substrate, and to otherwise ready the substrate's surface for a deposition process. It should also generally be noted that when the term "ozone" is used in this disclosure, it is being used not to necessarily require "pure, 100%" ozone—that is, generally speaking, ozone is typically not used in pure form, i.e., it is typically mixed with other gasses such as oxygen in an approximately ⅕ ratio. Such a mixture is typically the instantiation of "ozone" in the specific processes advanced by this disclosure. Also, it should be understood that the various atomic ratios expressed in this disclosure are approximate but may vary and may encompass both varying stoichiometry and non-stoichiometric compounds; without limiting this principle, as used herein, MOx and $MO_x$ (i.e., where "x" is used as a subscript) should both be understood to refer to oxides of a metal "M" of unknown stoichiometry, e.g., encompassing both multiple different ratios (e.g., MoO, $MoO_2$) as well as varying integer or non-integer ratios (e.g., $Mo_{0.95-1.95}$). Finally, the expression "primary" constituent or "primary" metal should be understood to refer to a constituent or metal (as appropriate) that is present in terms of composition in greater amounts than any other single constituent or metal (as appropriate).

The dielectric constant of a dielectric material is dependent upon the crystalline phase(s) of the material. For example, the cubic and tetragonal phases of zirconium oxide have a higher-k value than the monoclinic phase. So, it is desirable to produce zirconium oxide based DRAM capacitors with the zirconium oxide in the cubic or tetragonal phase. Similarly, in the case of titanium oxide, the anatase crystalline phase of titanium oxide has a dielectric constant of approximately 40, while the rutile crystalline phase of titanium oxide can have a dielectric constant of approximately >80. Due to the higher-k value of the rutile-phase, it is desirable to produce titanium oxide based DRAM capacitors with the titanium oxide in the rutile-phase.

The crystal phase of an adjacent layer can be used to influence the growth of a specific crystal phase of a material if their crystal structures are similar and their lattice constants are similar. This technique is well known in technologies such as epitaxial growth. The same concepts have been extended to the growth of thin films where the adjacent layer can be used as a "template" to encourage the growth of a desired crystalline phase over other competing crystal phases.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides such as titanium nitride, tantalum nitride, tungsten nitride, etc. have attracted interest as DRAM capacitor electrodes with titanium nitride being the most popular. Additionally, titanium nitride is a rigid material and has good mechanical strength. These are important properties for advanced DRAM designs such as crown structures as discussed previously. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode because they act more like insulators and have crystal structures that do not promote the formation of the rutile-phase of titanium oxide. For example, $MoO_3$ (the most oxygen-rich phase) is a dielectric material and has an orthorhombic crystal structure. However, $MoO_2$ is not as rigid as titanium nitride and does not possess the mechanical strength to serve as a robust frame of an advanced DRAM structure such as a crown design.

DRAM capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

The crystalline phases of dielectric materials exhibit higher-k values than their amorphous phases. Therefore, there is often an optional anneal step either after the dielectric formation step (also known as a post dielectric anneal (PDA)) or an anneal step after the formation of the top electrode (also known as a post metallization anneal (PMA)) to crystallize the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

The amorphous phases of dielectric materials exhibit lower leakage current behavior than the crystalline phases, most likely due to the lower number of defects due to the lack of grain boundaries. Thin films can often be deposited in the amorphous phase by incorporating a high concentration of dopants into the film or limiting thickness to typically less than 2 nm. As used herein, the dopant may be electrically active or not electrically active. The definition excludes residues and impurities such as carbon, etc. that may be present in the material due to inefficiencies of the process or impurities in the precursor materials.

In FIGS. 2, 4, 5, and 11 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention. In FIGS. 6-10 below, a capacitor stack is illustrated using a simple crown structure. Those skilled in the art will appreciate that the description and teachings to follow can be readily applied to any simple or complex capacitor morphology. The drawings are for illustrative purposes only and do not limit the application of the present invention.

FIG. 1 describes a method, 100, for fabricating a DRAM capacitor stack. The initial step, 102, comprises forming a first electrode material. Examples of suitable electrode materials comprise metals, conductive metal oxides, conductive metal silicides, conductive metal carbides, conductive metal nitrides, or combinations thereof. Two particularly interesting classes of materials are the conductive metal nitrides and the conductive metal oxides. The first electrode material may receive an optional treatment (not shown). In the next step, 104, a dielectric material is formed above the first electrode material. The dielectric material may comprise a single material or may comprise several materials. The dielectric material may receive an optional PDA treatment (not shown). In the next step, 106, a second electrode material is formed above the dielectric material. The capacitor stack may receive an optional PMA anneal (not shown).

Those skilled in the art will appreciate that each of the first electrode material, the dielectric material(s), and the second electrode material used to form the DRAM capacitor may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
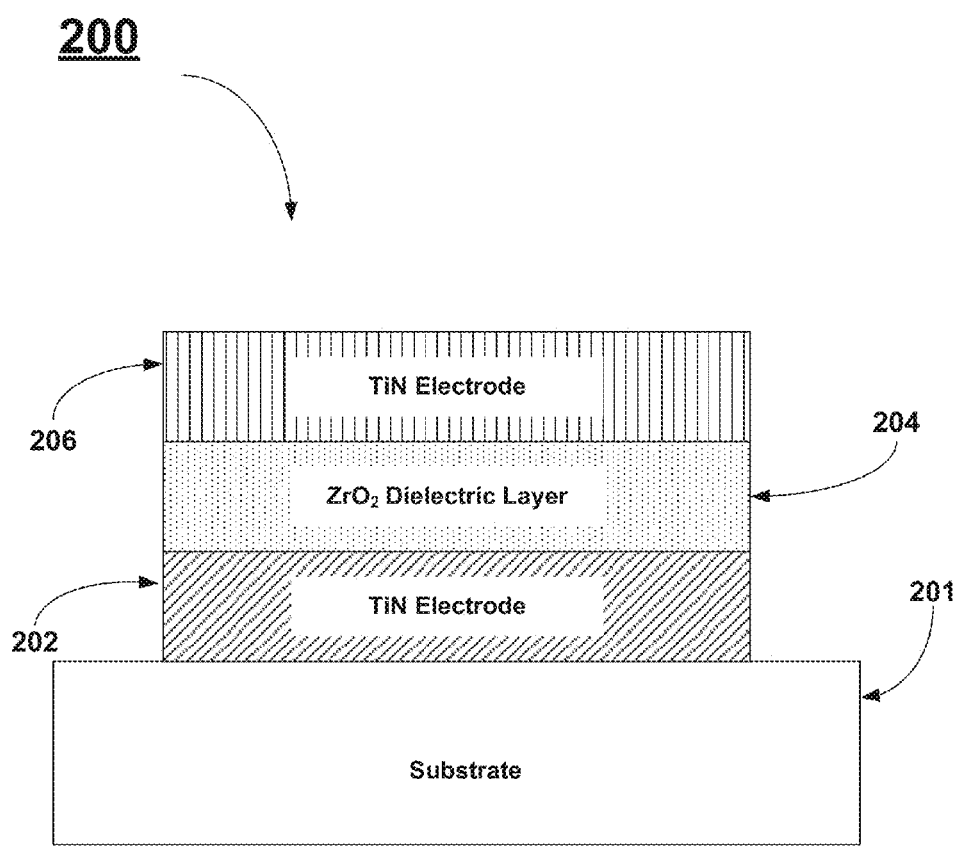
FIG. 2 simplified cross-sectional view of a DRAM capacitor stack fabricated in accordance with some embodiments of the present invention.

FIG. 2 illustrates a simplified cross-sectional view of a DRAM capacitor stack fabricated in accordance with some embodiments of the present invention. This example will use zirconium oxide as the dielectric material. However, those skilled in the art will understand that the present methods may be applied to many dielectric materials. First electrode material, 202, is formed on substrate, 201. When zirconium oxide is used as the dielectric material, the first electrode material is advantageously titanium nitride. The titanium nitride first electrode material may optionally receive a treatment before the formation of the multi-layer dielectric material as discussed previously. Zirconium oxide dielectric material, 204, is then formed above the titanium nitride first electrode material. Advantageously, the zirconium oxide dielectric material may be doped. Suitable dopants for use with zirconium oxide dielectric materials comprise Al, Ce, Co, Er, Ga, Gd, Ge, Hf, In, La, Lu, Mg, Mn, Nd, Pr, Sc, Si, Sn, Sr, Y, or combinations thereof. The dielectric material may optionally receive a PDA treatment as discussed previously. Second electrode material, 206, is then formed above the dielectric material. When zirconium oxide is used as the dielectric material, the second electrode material is advantageously titanium nitride. The capacitor stack may optionally receive a PMA treatment as discussed previously.

As discussed previously, the capacitor stack illustrated in FIG. 2 does not meet the leakage current, EOT, and physical thickness requirements for future DRAM devices. It is desirable to develop a dielectric material with a higher k-value and a capacitor stack that meets the overall EOT and physical thickness requirements for future DRAM devices. Advantageously, the zirconium oxide dielectric material should be replaced with a dielectric material that has a higher k-value (e.g. rutile phase titanium oxide). This would allow the capacitor to exhibit a lower EOT value. As mentioned previously, the band gap of dielectric materials generally decreases as the k-value increases, leading to an increase in leakage current. This may be overcome by using electrode materials with higher work functions. The work function of titanium nitride is about 4.8 eV. This is too low to be used directly with rutile phase titanium oxide and still meet the leakage current specifications of advanced DRAM devices. Therefore, a simple replacement of the zirconium oxide dielectric in FIG. 2 with rutile phase titanium oxide does not result in a DRAM device that meets all of the specifications.

The specifications for advanced DRAM devices may be met by replacing the zirconium oxide dielectric material in FIG. 2 with a multi-layer dielectric material. The benefits of using a conductive metal nitride (e.g. titanium nitride) as the first electrode have been discussed previously. A first dielectric material can be formed above the first electrode material wherein the first dielectric material is amorphous. Typically, dielectric materials can be made amorphous by incorporating dopants into the material or limiting thickness to typically less than 2 nm, as will be discussed below. The first dielectric material is effective at reducing the leakage current since the amorphous layer has no grain boundaries to act as potential conduction paths through the dielectric material. However, the amorphous dielectric material will generally have a lower k-value. A second dielectric material can be formed above the first dielectric material. The second dielectric material is selected to have a high k-value and serves to minimize the EOT of the capacitor stack. The second dielectric material can be undoped or lightly doped. The second dielectric material will generally be crystalline (following a subsequent anneal step). The second dielectric material will generally have a low band gap, therefore, a second electrode material should be selected that has a high work function. This will serve to decrease the leakage current of the device. Advantageously, the second electrode material may be selected to promote beneficial crystalline phases of the second dielectric material during the subsequent anneal steps. This has the effect of promoting the crystalline phase of the second dielectric material that has the highest k-value. The second electrode material does not participate in the structural support of the DRAM capacitor cell, so the rigidity and mechanical strength of the second electrode material are not as critical as for the first electrode material.

Figure 3:
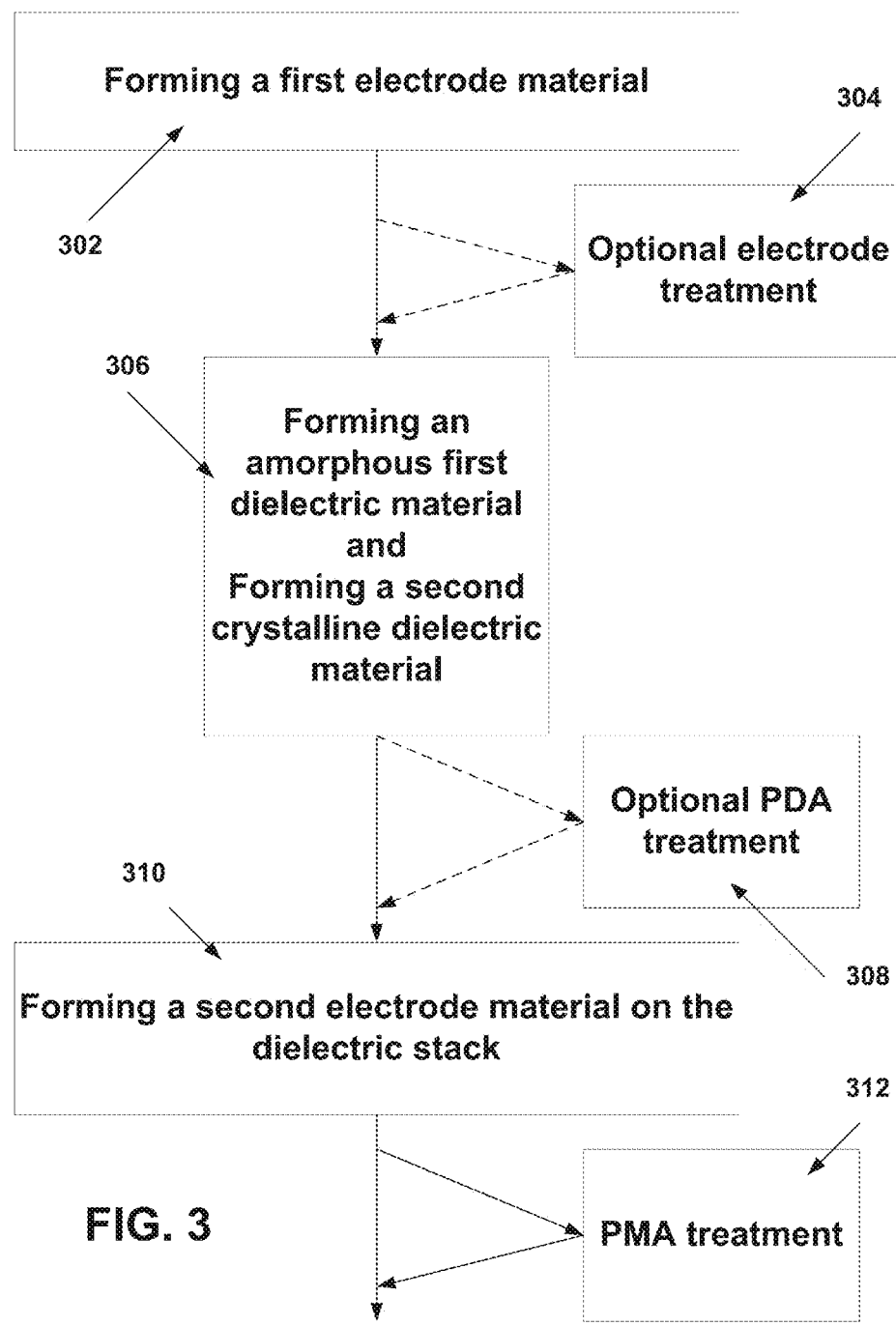
FIG. 3 illustrates a flow chart for the formation of a capacitor stack in accordance with some embodiments of the present invention.

FIG. 3 illustrates a flow chart of the formation of a capacitor stack according to some embodiments of the present invention. In step 302, a first electrode material is formed. Examples of suitable electrode materials comprise metals, conductive metal oxides, conductive metal silicides, conductive metal carbides, conductive metal nitrides, or combinations thereof. Step 304 is an optional step wherein the first electrode material may undergo a treatment before the dielectric material is formed. If the first electrode material is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, entitled "Electrode Treatments for Enhanced DRAM Performance" and is incorporated herein by reference. As discussed previously, the conductive metal nitride materials (e.g. titanium nitride) are rigid materials that exhibit good mechanical strength. As an example, titanium nitride has a hardness of 9 on the Mohs hardness scale and $MoO_2$ has a hardness of 4.6 on the Mohs hardness scale. Preferably the first electrode material has a higher hardness than that of $MoO_2$ on the Mohs hardness scale. Alternatively, if the first electrode material is a conductive metal oxide, then the first electrode layer may be annealed in an inert or reducing atmosphere such as Ar, $N_2$, or forming gas. Examples of such an annealing process is further described in U.S. application Ser. No. 13/084,666 filed on Apr. 12, 2011, entitled "METHOD FOR FABRICATING A DRAM CAPACITOR" and is incorporated herein by reference.

In step 306, a multi-layer dielectric material is formed wherein the first dielectric material is formed as an amorphous material. Typically, the first dielectric material is sufficiently thin (<2 nm) or highly doped to maintain the amorphous phase after subsequent anneal steps. As discussed previously, the first dielectric material will generally have a wide band gap, and therefore, a lower k-value. A second dielectric material is then formed above the first dielectric material. The second dielectric material is sufficiently thick (>3 nm) or typically un-doped or lightly doped so that it will crystallize during subsequent anneal steps. The second dielectric material may be the same bulk dielectric material or may be a different bulk dielectric material as the first dielectric material. Additionally, the dopant used in the second dielectric material may be the same dopant or may be a different dopant as that used in the first dielectric material.

After the dielectric material has been formed, an optional PDA treatment may be performed as shown in step 308, as discussed earlier. In step, 310, a second electrode material is formed adjacent to the second dielectric material. Examples of suitable electrode materials comprise metals, conductive metal oxides, conductive metal silicides, conductive metal carbides, conductive metal nitrides, or combinations thereof. Advantageously, the second electrode material will serve as a templating layer for the second dielectric material during the subsequent anneal steps and promote the formation of the high k-value crystalline phases of the second dielectric material. After the second electrode material has been formed, a PMA treatment will be performed as shown in step, 312 as discussed earlier. The PMA treatment comprises an anneal in $N_2$ at between about 400 C. to about 600 C. for between about 1 millisecond to about 60 minutes. The PMA treatment generally has a lower oxygen concentration to prevent oxidation of the two electrode layers.

Figure 4:
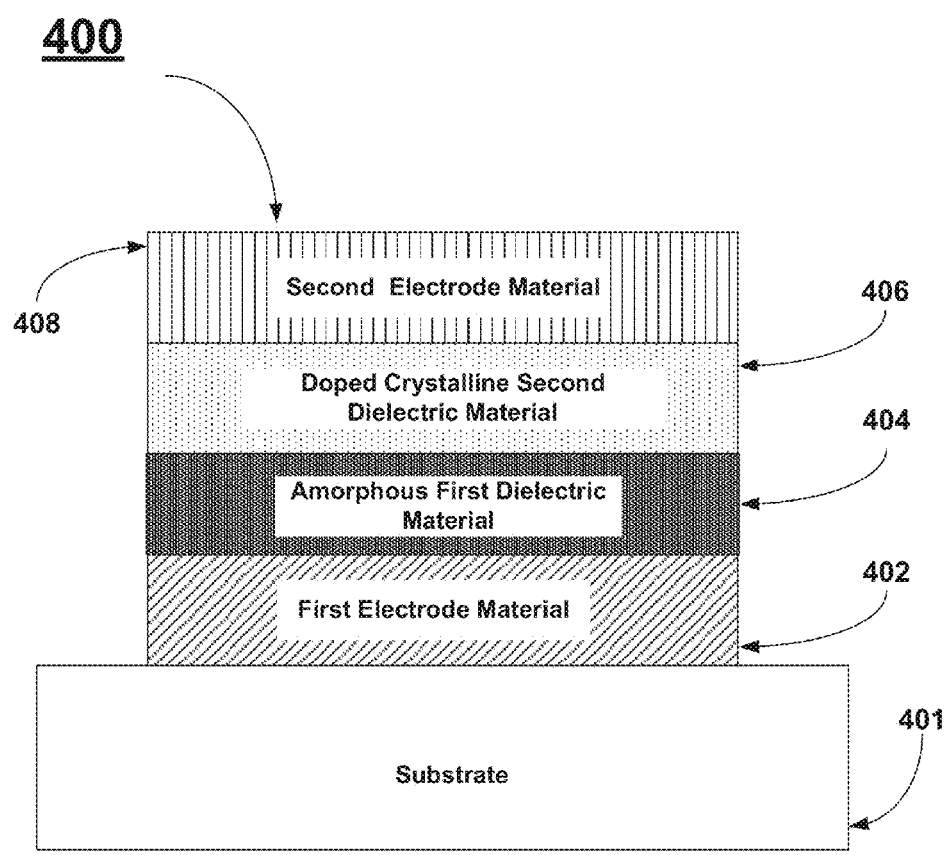
FIG. 4 illustrates a simplified cross-sectional view of a DRAM capacitor stack fabricated in accordance with some embodiments of the present invention.

FIG. 4 illustrates a simplified cross-sectional view of a DRAM capacitor stack fabricated in accordance with some embodiments of the present invention. First electrode material, 402, is formed above substrate, 401. Examples of suitable electrode materials comprise metals, conductive metal oxides, conductive metal silicides, conductive metal carbides, conductive metal nitrides, or combinations thereof. As discussed previously, the conductive metal nitride materials (e.g. titanium nitride) are rigid materials that exhibit good mechanical strength. The first electrode material may optionally receive an anneal treatment before the formation of the multi-layer dielectric material as discussed previously.

First dielectric material, 404, is formed above the first electrode material. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the first dielectric material is sufficiently thin (<2 nm) or highly doped to maintain the amorphous phase after subsequent anneal steps. As discussed previously, the first dielectric material will generally have a wide band gap, and therefore, a lower k-value. Second dielectric material, 406, is then formed above the first dielectric material. The second dielectric material may also comprise one of the dielectric material examples listed above. The second dielectric material is sufficiently thick (>3 nm) or typically un-doped or lightly doped so that it will crystallize during subsequent anneal steps. As discussed previously, the second dielectric material will generally have a narrow band gap, and therefore, a higher k-value. The second dielectric material contributes to the low EOT behavior of the capacitor stack. The second dielectric material may be the same bulk dielectric material or may be a different bulk dielectric material as the first dielectric material. Additionally, the dopant used in the second dielectric material may be the same dopant or may be a different dopant as that used in the first dielectric material.

After the dielectric material has been formed, an optional PDA treatment may be performed as discussed earlier. Second electrode material, 408, is formed adjacent to the second dielectric material. Examples of suitable electrode materials comprise metals, conductive metal oxides, conductive metal silicides, conductive metal carbides, conductive metal nitrides, or combinations thereof. Advantageously, the second electrode material will serve as a templating layer for the second dielectric material during the subsequent anneal steps and promote the formation of the high k-value crystalline phases of the second dielectric material. After the second electrode material has been formed, a PMA treatment will be performed.

Figure 5:
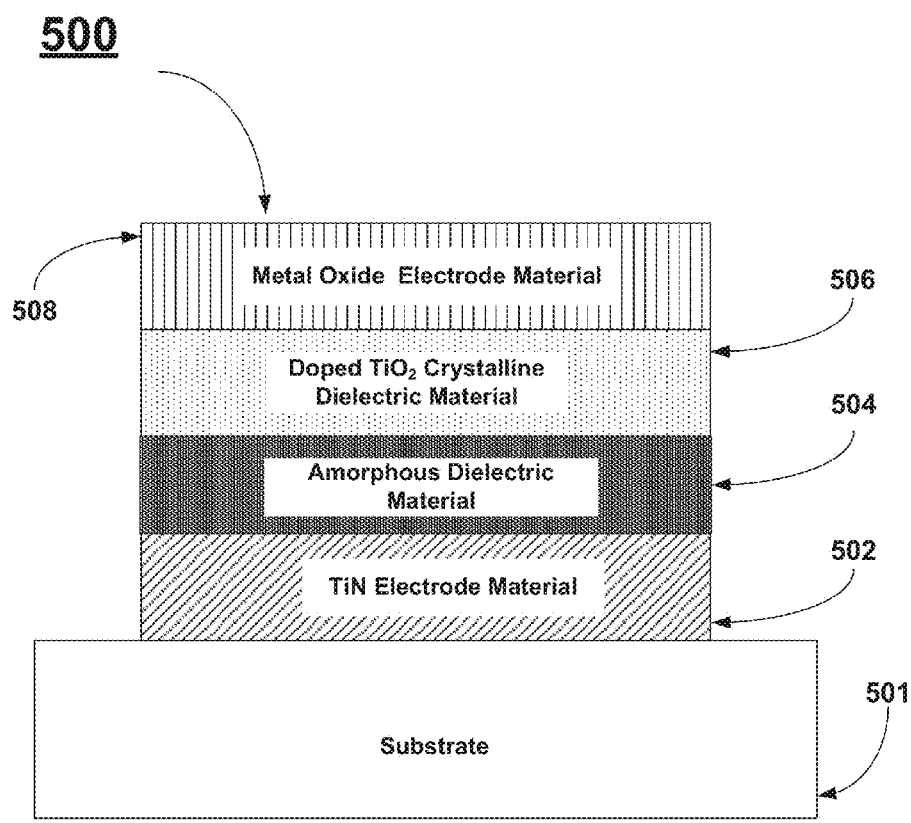
FIG. 5 illustrates a simplified cross-sectional view of a DRAM capacitor stack fabricated in accordance with some embodiments of the present invention.

FIG. 5 illustrates a simplified cross-sectional view of a DRAM capacitor stack fabricated in accordance with some embodiments of the present invention. First electrode material, 502, is formed above substrate, 501. Examples of suitable electrode materials comprise metals, conductive metal oxides, conductive metal silicides, conductive metal carbides, conductive metal nitrides, or combinations thereof. In this example, the first electrode material comprises a titanium nitride material. The titanium nitride material is rigid and exhibits good mechanical strength. The titanium nitride material may be doped or un-doped. The first electrode material may optionally receive an anneal treatment before the formation of the multi-layer dielectric material as discussed previously.

First dielectric material, 504, is formed above the first electrode material. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the first dielectric material is highly doped to maintain the amorphous phase after subsequent anneal steps. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof. In a specific example, the first dielectric material may comprise one of aluminum oxide, erbium oxide, lanthanum oxide, zirconium oxide, or combinations thereof. Second dielectric material, 506, is then formed above the first dielectric material. The second dielectric material may comprise one of the dielectric material examples listed above. In this example, the second dielectric material is titanium oxide. Titanium oxide has a high k-value, especially when formed into the rutile crystal phase. The second dielectric material is typically un-doped or lightly doped so that it will crystallize during subsequent anneal steps. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof.

After the dielectric material has been formed, an optional PDA treatment may be performed as discussed earlier. Second electrode material, 508, is formed above the multi-layer dielectric material. Examples of suitable electrode materials comprise metals, conductive metal oxides, conductive metal silicides, conductive metal carbides, conductive metal nitrides, or combinations thereof. The second electrode material is selected to have a high work function to reduce the leakage current for the capacitor cell. Advantageously, the second electrode material will also serve as a templating layer for the second dielectric material during the subsequent anneal steps and promote the formation of the high k-value crystalline phases of the second dielectric material. In this example, the second electrode material comprises a conductive metal oxide material. When titanium oxide is used as the second dielectric material, it is advantageous that the second electrode material have a rutile-like crystal structure so that it can promote the formation of the high k-value rutile crystalline phase of titanium oxide. A rutile-like crystal structure has a distorted rutile structure. Examples of suitable conductive metal oxide materials that have a rutile-like crystal structure comprise chromium oxide, manganese oxide, molybdenum oxide, rhenium oxide, ruthenium oxide, doped tin oxide, and, tungsten oxide.

After the second electrode material has been formed, a PMA treatment will be performed. The anneal treatment may be a rapid thermal anneal (RTA) anneal, or may be a millisecond anneal (MA). RTA anneals are typically performed between about 450 C. and about 600 C. in an inert gas, nitrogen, forming gas, or dilute oxygen (i.e. an oxygen content of less than about 40%). RTA anneal processes are well established in the manufacture of semiconductor devices.

Examples of the use of a millisecond anneal can be found in U.S. patent application Ser. No. 13/153,626 entitled "Method for Fabricating a DRAM Capacitor" filed on Jun. 6, 2011 which is herein incorporated by reference. As used herein, a MA process will be understood to be an anneal process wherein the temperature of the substrate is raised to the final temperature in less than one second. This will distinguish the MA process from RTA processes that can take place in timeframes as short as several seconds. The MA process may also be called a "spike anneal" process. In this process, the temperature of the surface substrate is raised from about room temperature to a process temperature between about 600 C. and about 1200 C. and advantageously to a temperature between about 600 C. and about 900 C. in less than one second and advantageously in less than about 10 milliseconds. The MA process may act to crystallize or further crystallize the dielectric layer. The MA process may be performed in an inert gas atmosphere. Additionally, if the MA process is performed using an oxidizing atmosphere, the concentration of oxygen vacancies ($V_{ox}$) may be reduced. By limiting the time of the MA process to times below one second, oxidation of the underlying electrode can be minimized. The milliseconds anneal process is performed in an atmosphere comprising between about 0% $O_2$ in $N_2$ to about 100% $O_2$ in $N_2$.

The MA process can be accomplished in system wherein flash lamps are used to quickly heat the surface of the substrate without significantly raising the temperature of the bulk. An example of a suitable system is the LA-3000 F system offered commercially by Dainippon Screen Manufacturing Company Limited with headquarters in Kyoto, Japan. This system utilizes xenon flash lamps to increase the substrate surface temperature.

Figure 6:
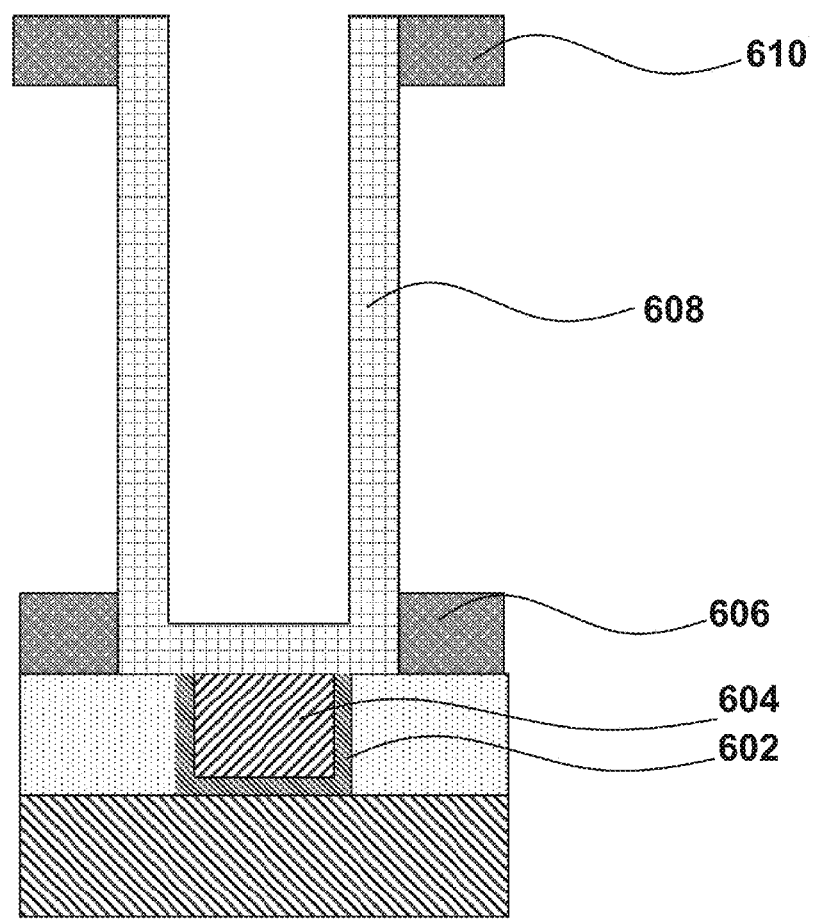
FIG. 6 illustrates a simplified cross-sectional view of a DRAM capacitor stack fabricated in accordance with some embodiments of the present invention.

FIG. 6 illustrates a simplified cross-sectional view of a DRAM capacitor crown structure fabricated in accordance with some embodiments of the present invention. The capacitor structure is connected to the remainder of the device through tungsten plug, 604, which is enclosed by diffusion barrier, 602. Typically, diffusion barrier, 602, is a conductive metal nitride such as titanium nitride. The first electrode material, 608, is fabricated to form a robust frame of crown structure as illustrated in FIG. 6. The capacitor cell further comprises dielectric spacers, 606 and 610. Typically, the dielectric spacers comprise silicon nitride. The various fabrication steps required to form the basic crown structure illustrated in FIG. 6 are well known and have been omitted for clarity. As discussed previously, titanium nitride has been successfully implemented as the first electrode material, 608, in the crown structure due to its rigid nature and good mechanical strength. Titanium nitride is able to form a robust frame of the crown structure and is able to serve as a support for the remaining layers that form the capacitor stack.

Figure 7:
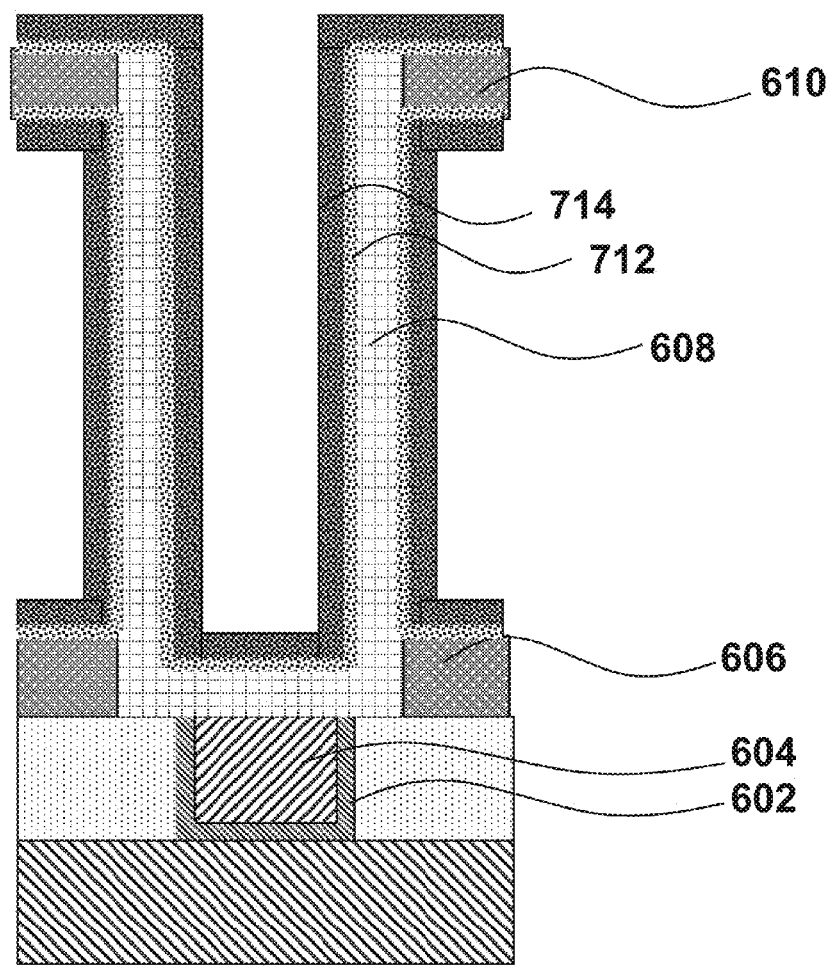
FIG. 7 illustrates a simplified cross-sectional view of a DRAM capacitor stack fabricated in accordance with some embodiments of the present invention.

FIG. 7 illustrates a simplified cross-sectional view of a DRAM capacitor structure fabricated in accordance with some embodiments of the present invention. FIG. 7 illustrates the crown structure of FIG. 6 after the first dielectric material, 712, and the second dielectric material, 714, have been formed on the first electrode material, 608. In a specific example, the first dielectric material may comprise one of aluminum oxide, erbium oxide, lanthanum oxide, titanium oxide, zirconium oxide, or combinations thereof. Typically, the first dielectric material comprises a dopant. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof. In this example, the second dielectric material is titanium oxide. The second dielectric material is typically un-doped or lightly doped so that it will crystallize during subsequent anneal steps. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof. Because of the complex morphology of the DRAM capacitor structure, the first dielectric material and the second dielectric material are typically formed using an ALD, PE-ALD, AVD, or CVD method of formation.

Figure 8:
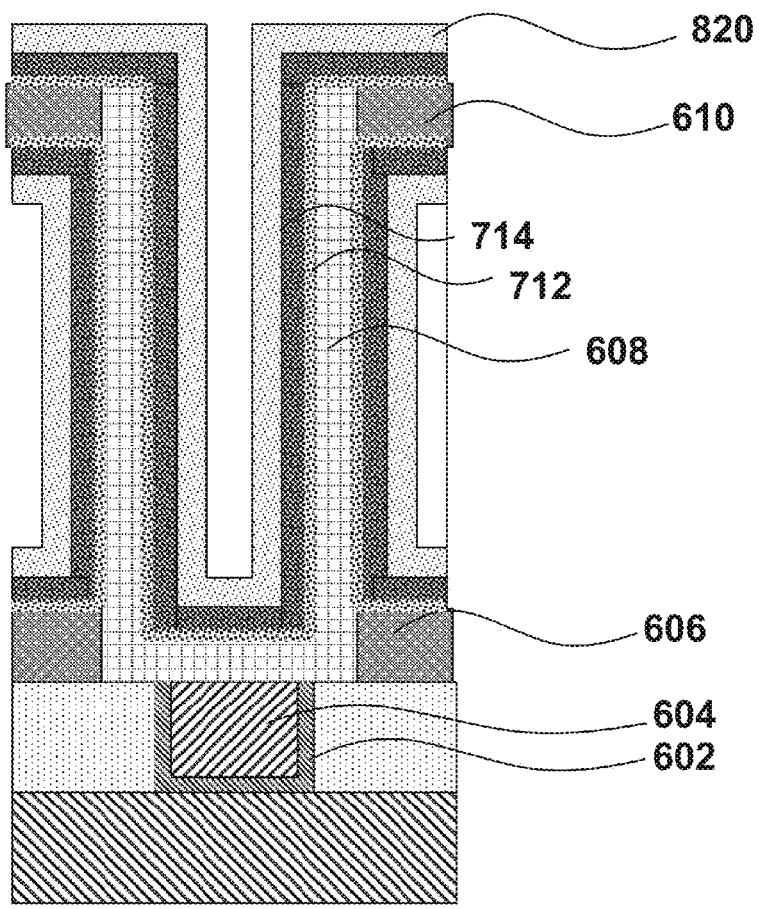
FIG. 8 illustrates a simplified cross-sectional view of a DRAM capacitor stack fabricated in accordance with some embodiments of the present invention.

FIG. 8 illustrates a simplified cross-sectional view of a DRAM capacitor structure fabricated in accordance with some embodiments of the present invention. FIG. 8 illustrates the crown structure of FIG. 7 after the second electrode material, 820, has been formed adjacent to the dielectric material, 712 and 714. In a specific example, the second electrode material is a conductive metal oxide. When titanium oxide is used as the second dielectric material, it is advantageous that the second electrode material have a high work function and a rutile-like crystal structure so that it can promote the formation of the high k-value rutile crystalline phase of titanium oxide. Examples of suitable conductive metal oxide materials that have a rutile-like crystal structure comprise chromium oxide, manganese oxide, molybdenum oxide, rhenium oxide, ruthenium oxide, and doped tin oxide. Because of the complex morphology of the DRAM capacitor structure, the second electrode material is typically formed using an ALD, PE-ALD, AVD, or CVD method of formation.

Figure 9:
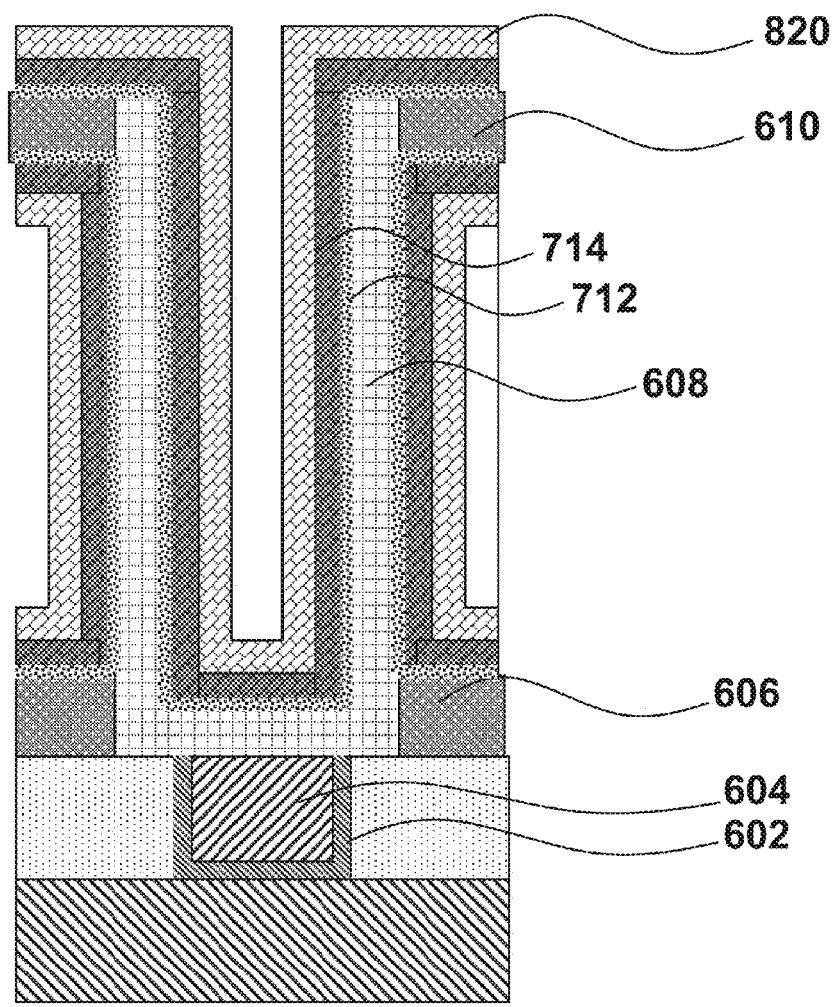
FIG. 9 illustrates a simplified cross-sectional view of a DRAM capacitor stack fabricated in accordance with some embodiments of the present invention.

FIG. 9 illustrates a simplified cross-sectional view of a DRAM capacitor structure fabricated in accordance with some embodiments of the present invention. FIG. 9 illustrates the crown structure of FIG. 8 after the capacitor stack has been annealed. After the anneal, the second dielectric material and the second electrode material have become crystallized. In a specific example, the second dielectric material comprises titanium oxide. In a specific example, the second electrode material is a conductive metal oxide. When titanium oxide is used as the second dielectric material, it is advantageous that the second electrode material have a high work function and a rutile-like crystal structure so that it can promote the formation of the high k-value rutile crystalline phase of titanium oxide. Examples of suitable conductive metal oxide materials that have a rutile-like crystal structure comprise chromium oxide, manganese oxide, molybdenum oxide, rhenium oxide, ruthenium oxide, and doped tin oxide. During the anneal process, both the second dielectric material and the second electrode material have become crystallized into a rutile-like crystalline phase. The first dielectric material, 712, has remained in an amorphous phase.

Figure 10:
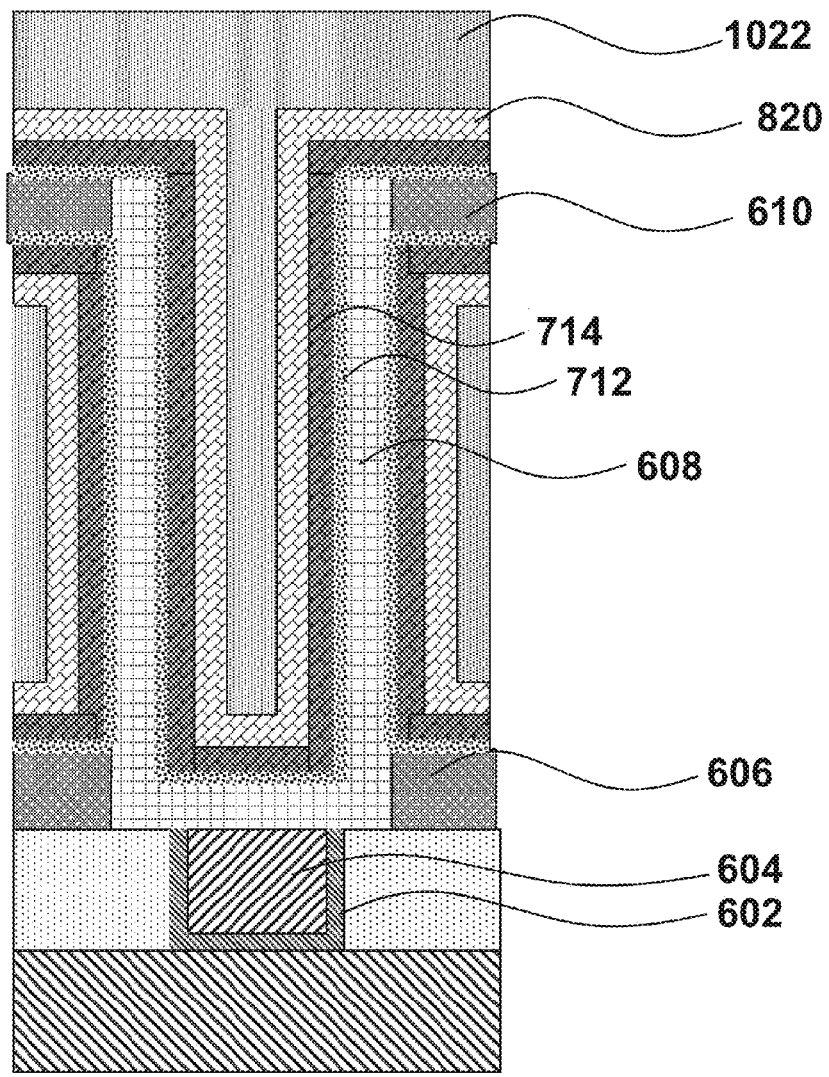
FIG. 10 illustrates a simplified cross-sectional view of a DRAM capacitor stack fabricated in accordance with some embodiments of the present invention.

FIG. 10 illustrates a simplified cross-sectional view of a DRAM capacitor structure fabricated in accordance with some embodiments of the present invention. FIG. 10 illustrates the crown structure of FIG. 9 after an interconnection material, 1022, has been formed to connect the second electrode material to the remainder of the DRAM device. An example of a suitable interconnection material comprises doped poly-Si or doped poly-SiGe. Boron is a typical dopant in these materials.

Figure 11:
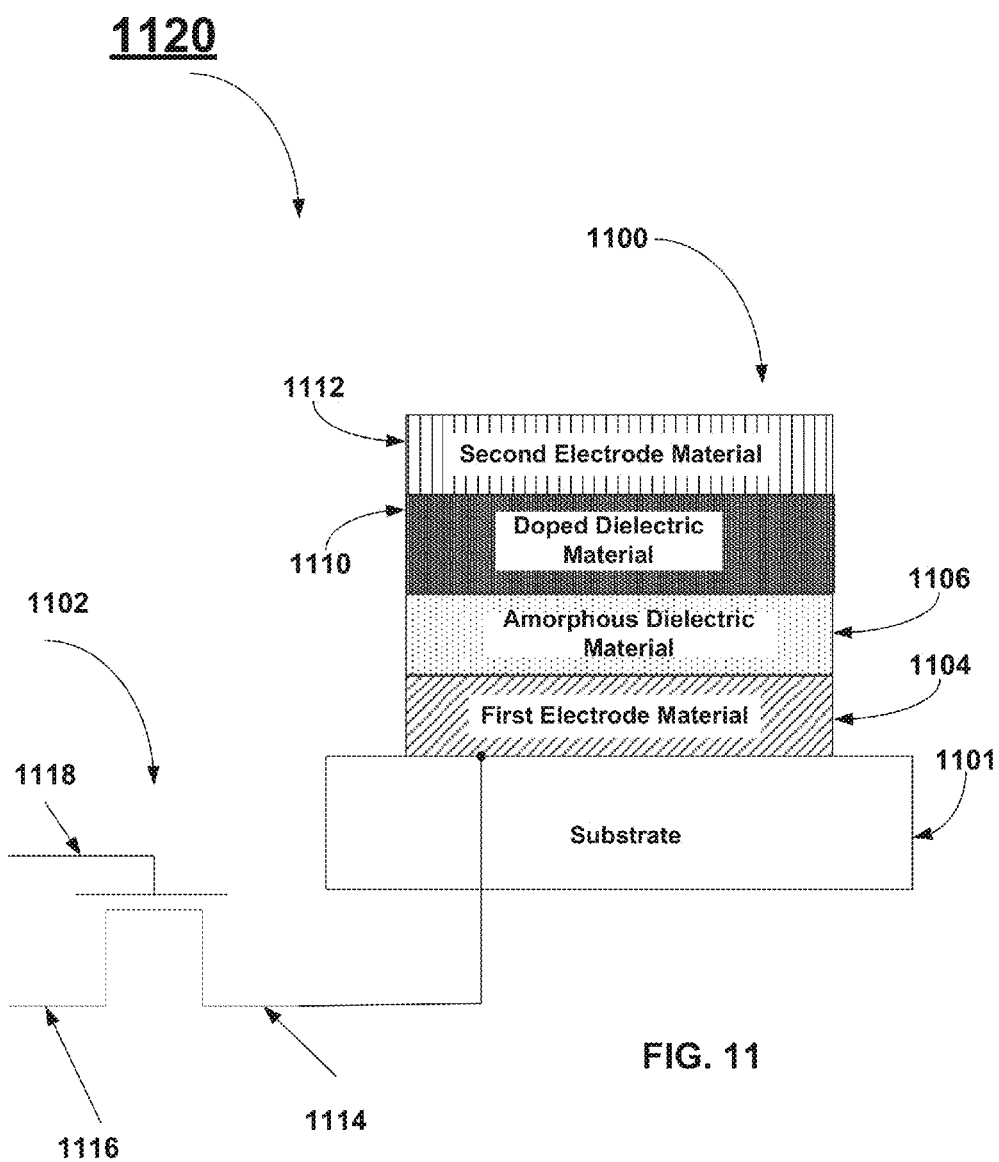
FIG. 11 illustrates a simplified view of a DRAM device fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 11 is used to illustrate one DRAM cell, 1120, manufactured using a structure as discussed previously. The cell, 1120, is illustrated schematically to include two principle components, a cell capacitor, 1100, and a cell transistor, 1102. The cell transistor is usually constituted by a MOS transistor having a gate, 1118, source, 1114, and drain, 1116. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 1100, comprises a first electrode material, 1104, formed above substrate, 1101. The first electrode material forms a robust frame of crown structure. The first electrode material, 1104, is connected to the source or drain of the cell transistor, 1102. For illustrative purposes, the first electrode has been connected to the source, 1114, in this example. In a specific example, the first electrode material comprises titanium nitride. As discussed previously, first electrode material, 1104, may be subjected to an anneal or other treatment before the formation of the dielectric material. First dielectric material, 1106, is formed above the first electrode material. In a specific example, the first dielectric material may comprise one of aluminum oxide, erbium oxide, lanthanum oxide, zirconium oxide, or combinations thereof. Typically, the first dielectric material comprises a dopant. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof. The first dielectric material remains amorphous after a subsequent anneal step. Second dielectric material, 1110, is formed above the first dielectric material. In a specific example, the second dielectric material may comprise titanium oxide. The second dielectric material may comprise a dopant. Examples of dopants comprise Al, Ce, Co, Er, Ga, Gd, Ge, Hf, In, La, Lu, Mg, Mn, Nd, Pr, Sc, Si, Sn, Sr, Y, Zr, or combinations thereof. Typically, the first electrode layer and the dielectric materials are then subjected to a PDA treatment. The second dielectric material will typically crystallize after a subsequent anneal step. Second electrode material, 1112, is formed adjacent to the second dielectric material. In a specific example, the second electrode material comprises a conductive metal oxide material. Advantageously, the metal oxide material has a high work function and a crystal structure that is rutile-like or distorted rutile-like and is compatible with the rutile crystal structure of the second dielectric material. Examples of such a metal oxide second electrode material include the conductive compounds of chromium oxide, manganese oxide, molybdenum oxide, rhenium oxide, ruthenium oxide, and doped tin oxide. This completes the formation of the capacitor stack. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A semiconductor layer stack comprising:
a first electrode material formed above a substrate;
a first dielectric material formed above the first electrode material;
a second dielectric material formed above the first dielectric material, the second dielectric material having a rutile-like crystal structure; and a second electrode material formed above the second dielectric material, wherein the second electrode material comprises a metal oxide having a rutile-like crystal structure configured to provide a template for the rutile-like crystal structure of the second dielectric material, and wherein the first dielectric material is amorphous and comprises one of barium-strontium-titanate (BST), silicate, niobium oxide, lead-zirconium-titanate (PZT), a bilayer of silicon oxide and silicon nitride, silicon oxy-nitride, strontium titanate (STO), tantalum oxide, or combinations thereof, wherein the first dielectric material has a higher dopant concentration than the second dielectric material.

2. The semiconductor layer stack of claim 1 wherein the first electrode material comprises one of a metal, metal alloy, conductive metal oxide, conductive metal silicide, conductive metal carbides, conductive metal nitride, or combinations thereof.

3. The semiconductor layer stack of claim 2 wherein the first electrode material comprises a conductive metal nitride comprising one of titanium nitride or doped titanium nitride.

4. The semiconductor layer stack of claim 1 wherein the first dielectric material comprises one of aluminum oxide, erbium oxide, lanthanum oxide, zirconium oxide, titanium oxide, or combinations thereof.

5. The semiconductor layer stack of claim 1 wherein the first dielectric material further comprises a dopant.

6. The semiconductor layer stack of claim 5 wherein the dopant comprises one of Al, Ce, Co, Er, Ga, Gd, Ge, Hf, In, La, Lu, Mg, Mn, Nd, Pr, Sc, Si, Sn, Sr, Y, or combinations thereof.

7. The semiconductor layer stack of claim 1 wherein the second dielectric material further comprises a dopant.

8. The semiconductor layer stack of claim 7 wherein the dopant comprises one of Al, Ce, Co, Er, Ga, Gd, Ge, Hf, In, La, Lu, Mg, Mn, Nd, Pr, Sc, Si, Sn, Sr, Y, Zr, or combinations thereof.

9. The semiconductor layer stack of claim 1 wherein the second electrode material comprises molybdenum oxide.

10. The semiconductor layer stack of claim 1 wherein the second electrode material is a conductive metal oxide comprising one of chromium oxide, manganese oxide, molybdenum oxide, rhenium oxide, or doped tin oxide.

11. The semiconductor layer stack of claim 1, wherein the first electrode material is thinner than the second electrode material.

12. The semiconductor layer stack of claim 1, wherein the first electrode material has a thickness of less than 2 nanometers.

13. The semiconductor layer stack of claim 1, wherein the first electrode material directly interfaces with the first dielectric material, and wherein the second dielectric material directly interfaces the second electrode material and the first dielectric material.

14. The semiconductor layer stack of claim 1, wherein the first dielectric material has a higher dopant concentration than the second dielectric material.

15. The semiconductor layer stack of claim 1, wherein the first dielectric material and the second dielectric material comprise a common dopant.

16. The semiconductor layer stack of claim 1, wherein the first dielectric material comprises a first dopant and wherein the second dielectric material comprises a second dopant different from the first dopant.

17. The semiconductor layer stack of claim 1, wherein the first dielectric material and the second dielectric material comprise a common bulk dielectric material.

18. The semiconductor layer stack of claim 1, wherein the first dielectric material comprises a first bulk dielectric material and wherein the second dielectric material comprises a second bulk dielectric material different from the first bulk dielectric material.

19. The semiconductor layer stack of claim 1, wherein the second electrode material serves as a templating layer for the second dielectric material during annealing.

20. The semiconductor layer stack of claim 19, wherein the second electrode material has a distorted rutile crystal structure.

* * * * *